(12) United States Patent
Zhu et al.

(10) Patent No.: US 8,541,293 B2
(45) Date of Patent: Sep. 24, 2013

(54) METHOD OF CONTROLLED LATERAL ETCHING

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics, Academy of Sciences, Beijing (CN)

( * ) Notice: Subject to any disclaimer, the term of this patent is extended or adjusted under 35 U.S.C. 154(b) by 0 days.

(21) Appl. No.: 13/509,604

(22) PCT Filed: Nov. 23, 2011

(86) PCT No.: PCT/CN2011/082703
§ 371 (c)(1),
(2), (4) Date: May 12, 2012

(87) PCT Pub. No.: WO2013/040836
PCT Pub. Date: Mar. 28, 2013

(65) Prior Publication Data
US 2013/0072023 A1    Mar. 21, 2013

(30) Foreign Application Priority Data
Sep. 21, 2011 (CN) .......................... 2011 1 0281364

(51) Int. Cl.
*H01L 21/36* (2006.01)
*H01L 21/84* (2006.01)
*H01L 21/00* (2006.01)
*H01L 21/336* (2006.01)

(52) U.S. Cl.
USPC ............ 438/479; 438/156; 438/257; 438/197

(58) Field of Classification Search
USPC .................................. 438/156, 197, 257, 479
See application file for complete search history.

(56) References Cited

U.S. PATENT DOCUMENTS

| | | | |
|---|---|---|---|
| 6,165,811 A | 12/2000 | Lee | |
| 7,005,700 B2 | 2/2006 | Lee | |
| 7,300,837 B2 | 11/2007 | Chen et al. | |
| 7,323,375 B2 | 1/2008 | Yoon et al. | |
| 7,960,235 B1 | 6/2011 | Song et al. | |
| 7,977,185 B2 * | 7/2011 | Greene et al. | 438/257 |
| 2005/0145926 A1 | 7/2005 | Lee | |
| 2005/0148142 A1 * | 7/2005 | Cabral et al. | 438/280 |
| 2005/0242395 A1 | 11/2005 | Chen et al. | |
| 2005/0250285 A1 | 11/2005 | Yoon et al. | |
| 2011/0159656 A1 | 6/2011 | Song et al. | |

FOREIGN PATENT DOCUMENTS

CN    102110648 A    6/2011

OTHER PUBLICATIONS

International Search Report (Nov. 23, 2011).
Written Opinion(Jul. 5, 2012).

* cited by examiner

*Primary Examiner* — Luan C Thai
(74) *Attorney, Agent, or Firm* — Goodwin Procter LLP

(57) ABSTRACT

A method of controlled lateral etching is disclosed. In one embodiment, the method may comprise: forming on a first material layer, which comprises a protruding structure, a second material layer; forming spacers on outer surfaces of the second material layer opposite to vertical surfaces of the protruding structure; forming a third material layer on surfaces of the second material layer and the spacers; forming on the third material layer a mask layer which extends in a direction lateral to a surface of the first material layer; and laterally etching portions of the respective layers arranged on the vertical surfaces of the protruding structure.

11 Claims, 8 Drawing Sheets

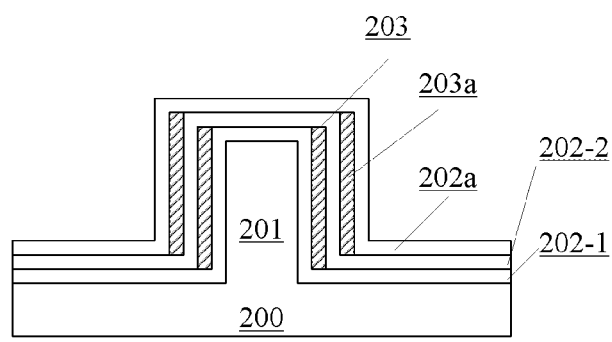
Fig. 3 (c')

US 8,541,293 B2

METHOD OF CONTROLLED LATERAL ETCHING

CROSS REFERENCE TO RELEVANT APPLICATION(S)

This application is a U.S. National Phase application of, and claims priority to, PCT International Application No. PCT/CN2011/082703, filed on Nov. 23, 2011, which claimed priority to Chinese Application No. 201110281364.8, filed on Sep. 21, 2011. Both the Chinese and International applications are entitled "METHOD OF CONTROLLED LATERAL ETCHING," which are incorporated herein by reference in their entireties.

TECHNICAL FIELD

The present disclosure relates to the semiconductor field, and more particularly, to a method of controlled lateral etching.

BACKGROUND

In the semiconductor processes, there is often a need for etching a material layer in a lateral direction, while not etching it in a vertical direction. Here, so called "lateral direction" means a direction substantially parallel to a substrate surface, and so called "vertical direction" means a direction substantially vertical to the substrate surface. FIG. 1 shows an example. As shown in FIG. 1, on a substrate 100 there is a feature 101 formed, which protrudes with respect to the substrate surface. The protruding structure 101 may be integral with the substrate 100 (as with the example shown in FIG. 1), or alternatively may be a different layer from the substrate 100 (not shown). Such an arrangement where a protruding structure is formed on a substrate is common in the semiconductor field. For example, a Fin Field Effect Transistor (FinFET) has a protruding fin formed on a substrate. Usually, a material layer 102 needs to be formed on both sides of the protruding structure 101 on the substrate 100. For example, in the situation of the FinFET, usually an isolation layer needs to be formed on both sides of the fin.

Conventionally, to form the material layer 102 on both sides of the protruding structure 101, a layer of material constituting the material layer 102 may be deposited on the substrate 100 (including the protruding structure 101), and then patterned to form the material layer 102. If there is an effective way to laterally etching the deposited layer to remove the material on side walls of the protruding structure 101, with no or very little etching in the vertical direction, the arrangement shown in FIG. 1 where the material layer 102 is formed on both sides of the protruding structure 101 on the substrate 100 will be achieved.

Unfortunately, there is no such an effective way of lateral etching yet. In the prior art, the arrangement shown in FIG. 1 is manufactured generally as follows. Specifically, as shown in FIG. 2(a), firstly a layer (102') of material constituting the material layer 102 is deposited on the substrate 100 (including the protruding structure 101). During the deposition, process parameters can be controlled so that the deposited layer 102' has a relatively large thickness in its portions extending in the lateral direction (i.e., portions positioned on the substrate 100) and a relatively small thickness in its portions extending in the vertical portion (i.e., portions positioned on the side walls of the protruding structure 101). Then, as shown in FIG. 2(b), the deposited layer 102' is isotropically etched to remove the portions of the deposited layer 102' on the side walls of the protruding structure 101. The portions of the deposited layer on the substrate 100 are left to some extent after the isotropic etching due to their relatively large thickness. Here, the material layer 102 may still remain on top of the protruding structure 101 (not shown in FIG. 2(b)).

However, there may be the following problems in the prior art. First, to deposit a material layer which is relatively thick in its portions extending in the lateral direction while relatively thin in its portions extending in the vertical direction causes a great challenge to the deposit process. Second, there is no effective control on etching in the lateral direction and the vertical direction.

In view of the above problems, there is a need for a method of controlled lateral etching.

SUMMARY

The present disclosure provides, among other things, a method of controlled lateral etching.

According to an embodiment, there is provided a method of controlled lateral etching, comprising: forming on a first material layer having a protruding structure, a second material layer; forming spacers on outer surfaces of the second material layer opposite to vertical surfaces of the protruding structure; forming a third material layer on surfaces of the second material layer and the spacers; forming a mask layer, which extends in a direction lateral to a surface of the first material layer, on the third material layer; and laterally etching portions of respective layers arranged on the vertical surfaces of the protruding structure.

According to some embodiments, spacers are inserted between the respective material layers so that the respective material layers are relatively narrow. Thus, the narrow width effect can occur during the etching process. Due to the narrow width effect, the etching is conducted dominantly in the lateral direction, but significantly less in the vertical direction. As a result, it is possible to achieve effective lateral etching.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
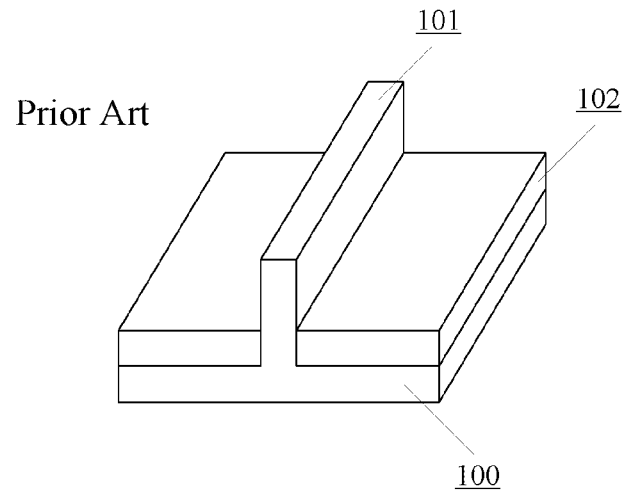
FIG. 1 is a schematic perspective view showing an example arrangement for which a lateral etching process is needed.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various layer structures according to the embodiments are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

Figure 3:
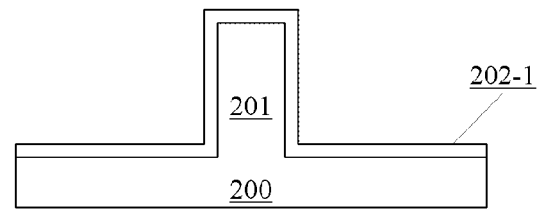
FIGS. 3(a)-3(j) are schematic sectional views showing a flow of controlled lateral etching according to an embodiment of the present disclosure.
Figure 3:
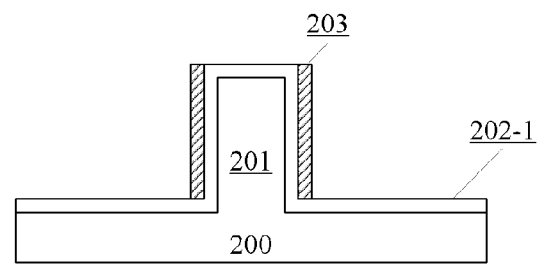
Figure 3:
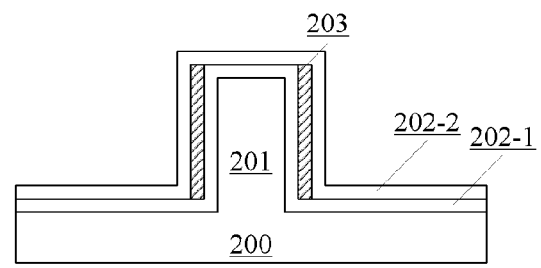
Figure 3:
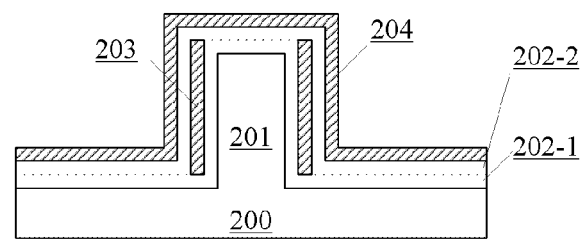
Figure 3:
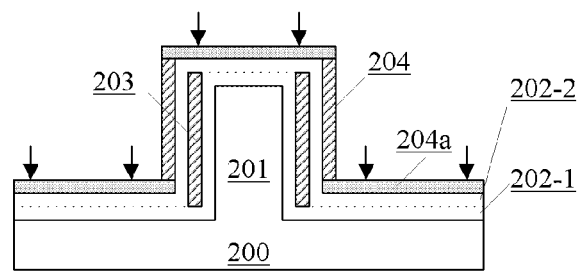
Figure 3:
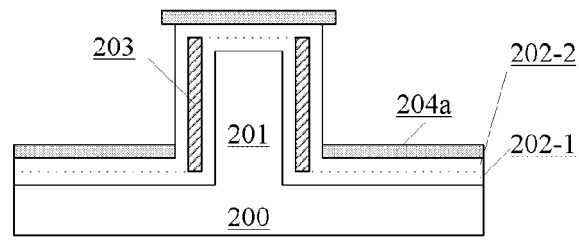
Figure 3:
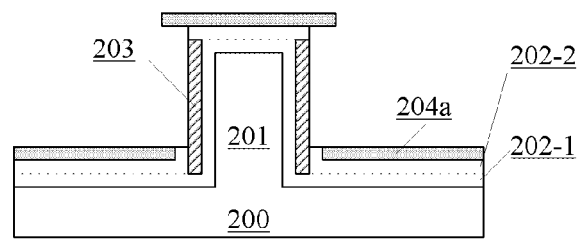
Figure 3:
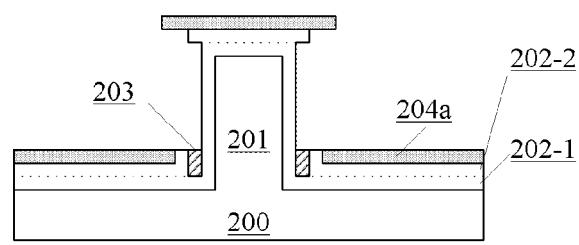
Figure 3:
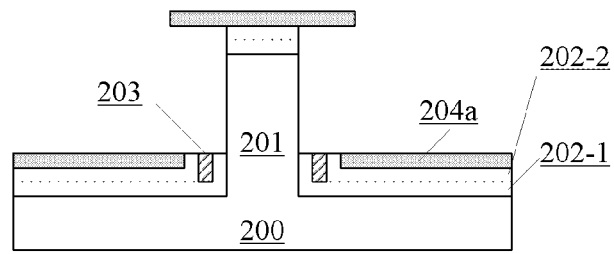
Figure 3:
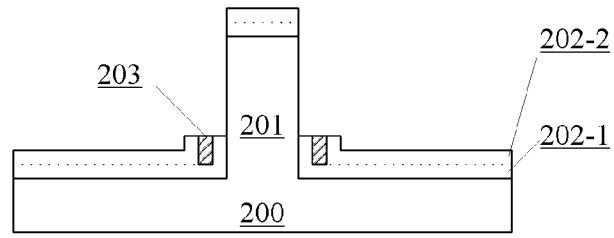

FIG. 3 shows a schematic flow of controlled lateral etching according to an embodiment of the present disclosure.

Specifically, as shown in FIG. 3(a), a first material layer 200 is provided, on which, a feature 201 is formed to protrude with respect to a surface of the first material layer 200. For example, the first material layer 200 may comprise a semiconductor substrate, including, but not limited to, a bulk semiconductor substrate, a group compound semiconductor substrate, a Semiconductor On Insulator (SOI) substrate, and the like, or other substrates such as a glass substrate. Alternatively, the first material layer 200 may be one provided on a substrate, for example, a semiconductor layer, a conductor layer or an insulator layer formed on a substrate. The protruding structure 201 may be formed from the first material layer 200 so that it is integral with the first material layer 200 (as with the example shown in FIG. 3(a)), or alternatively may be formed by patterning a further material layer provided on the first material layer 200. For example, the protruding structure 201 may comprise a fin, and the first material layer 200 may comprise a bulk semiconductor substrate.

Hereinafter, an example where the first material layer 200 is a bulk Si semiconductor substrate and the protruding structure 201 is a Si fin formed on the bulk Si semiconductor substrate is described. However, it is to be noted that the present disclosure is not limited thereto.

A second material layer 202-1, such as oxide (e.g., $SiO_2$), may be formed (e.g., deposited) on the first material layer 200 (including the protruding structure 201). Here, there is no need for special control on process parameters during the deposition to make the second material layer 202-1 have a greater thickness in its portions extending in a lateral direction than in its portions extending in a vertical direction, unlike the prior art. For example, the second material layer 202-1 may have a thickness of for example, about 5-10 nm substantially same in the portions extending in the vertical direction and the lateral direction.

Next, as shown in FIG. 3(b), spacers 203 may be formed on both sides of the protruding structure 201 (specifically, on outer surfaces of the second material layer 202-1 opposite to vertical surfaces of the protruding structure 201). For example, the spacers may be formed by depositing a spacer material layer and then Reactive Ion Etching (RIE) it. The process to form the spacers is known in the art, and detailed descriptions thereof are omitted here. According to an embodiment, the spacers 203 may comprise undoped amorphous Si, and may have a thickness of about 5-10 nm, for example.

Then, as shown in FIG. 3(c), a third material layer 202-2 may be further formed (e.g., deposited) on the whole arrangement, specifically, on surfaces of the second material layer 202-1 and the spacers 203. The third material layer 202-2 may comprise the same material as the second material layer 202-1, such as oxide (e.g., $SiO_2$) or High Density Plasma (HDP) oxide (e.g., $SiO_2$). Here, there is also no need for special control on the process parameters during the deposition to make the third material layer 202-2 have a greater thickness in its portions extending in the lateral direction than in its portions extending in the vertical direction, unlike the prior art. For example, the third material layer 202-2 may have a thickness of for example, about 5-10 nm substantially same in the portions extending in the vertical direction and the lateral direction.

Figure 2:
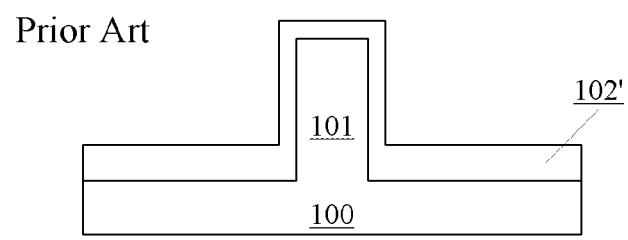
FIGS. 2(a) and 2(b) show a illustrative flow of manufacturing the arrangement shown in FIG. 1 according to the prior art.
Figure 2:
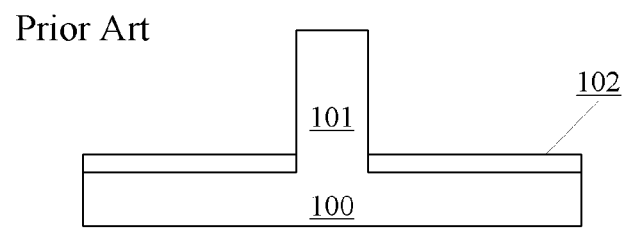

Referring to the arrangement shown in FIG. 3(c), the second material layer 202-1 and the third material layer 202-2 can constitute a functional layer similar to the deposited layer 102' shown in FIG. 2. Unlike the arrangement shown in FIG. 2, in the example shown in FIG. 3(c) the functional layer (202-1 and 202-2) may have a thickness substantially same in its portions extending in the vertical direction and the lateral direction. As a result, the process to form the functional layer (202-1 and 202-2) can be simplified.

It is to be noted that the second material layer 202-1 and the third material layer 202-2 may or may not have the same material. For example, in a situation of a FinFET, the second material layer 202-1 and the third material layer 202-2 may both comprise $SiO_2$ and thus constitute an isolation layer in a later stage. Certainly the second material layer 202-1 and the third material layer 202-2 may comprise different dielectric materials. This has almost no impact on the performance of the finally obtained isolation layer. In the following drawings, an interface between the second material layer 202-1 and the third material layer 202-2 is shown by a dashed line.

Further, the spacers 203 are inserted into portions of the functional layer (202-1 and 202-2) which are to be etched laterally (i.e., portions positioned on side walls of the protruding structure 201). As will be described in the following, the spacers 203 can function to effectively control the lateral etching. Although FIG. 3 shows an example where the functional layer comprises two sub-layers (202-1 and 202-2) and spacers (203) are inserted between the two sub-layers, the present disclosure is not limited thereto. The functional layer may comprise more than two sub-layers, and spacers may be inserted between adjacent sub-layers. For example, in the example shown in FIG. 3(c'), further spacers 203a similar to the spacers 203 may be formed on both sides of the protruding structure 201 (specifically, on outer surfaces of the third material layer 202-2 opposite to the vertical surfaces of the protruding structure 201), a further material layer 202a similar to the second material layer 202-1 and the third material layer 202-2 may be further formed, as shown in FIG. 3(c'), and so on.

When the arrangement shown in FIG. 3(c) is achieved, the functional layer (202-1 and 202-2) can be etched laterally. For this purpose, a mask layer extending in the lateral direction may be formed, to substantially avoid etching in the vertical direction.

According to an embodiment, the mask layer may be provided as follows. Specifically, as shown in FIG. 3(d), a layer 204 of undoped amorphous Si may be formed on the entire arrangement shown in FIG. 3(c), with a thickness of about 5-10 nm, for example. Then, as shown by arrows in FIG. 3(e), portions of the amorphous Si layer 204 extending in the lateral direction may be doped, for example, p-type doped. This can be achieved by implanting $BF_2$ into the amorphous Si layer 204 and then performing annealing (e.g., laser annealing or fast annealing) to activate the implanted dopants, for example. Due to thermal treatments such as annealing, the amorphous Si material can be converted to the polysilicon material. During the implanting process, the implanting direction can be controlled to be vertical, so that the dopants are implanted substantially into the portions of the amorphous Si layer 204 extending in the lateral direction (gray portions shown in FIG. 3(*e*)), without or with a very few amount thereof being implanted into portions of the amorphous Si layer 204 extending in the vertical direction (hatched portions shown in FIG. 3(*e*)). Next, as shown in FIG. 3(*f*), the undoped polysilicon may be selectively etched with respect to the p-type doped polysilicon material. As a result, the p-type doped polysilicon layer 204*a* extending in the lateral direction is left. The p-type doped polysilicon layer 204*a* can serve as an etching mask in the following process, to substantially avoid etching in the vertical direction. Here, it is to be noted that the mask layer is not limited to a p-type doped one, and may be n-type doped instead.

Then, etching can be conducted to remove the portions of the functional layer (202-1 and 202-2) on the side walls of the protruding structures 201.

Specifically, as shown in FIG. 3(*g*), firstly the third material layer 202-2 (e.g., $SiO_2$) may be selectively etched with respect to the polysilicon material. Due to the presence of the spacers 203, the third material layer 202-2 is relatively narrow. Thus, the etching rate in the vertical direction is much less than the etching rate in the lateral direction due to the narrow width effect. As a result, the etching is conducted dominantly in the lateral direction, but significantly less in the vertical direction. Then, as shown in FIG. 3(*h*), the spacers 203 of undoped polysilicon are selectively etched with respect to the p-type doped polysilicon layer 204*a*. Next, as shown in FIG. 3(*i*), the second material layer 202-1 (e.g., $SiO_2$) may be selectively etched with respect to the polysilicon material. Likewise, the etching rate in the vertical direction is much less than the etching rate in the lateral direction due to the narrow width effect. As a result, the etching is conducted dominantly in the lateral direction, but significantly less in the vertical direction.

It can be seen that the functional layer (202-1 and 202-2) are divided into the two material layers by the spacers 203 (or alternatively, into more material layers by more spacers) so that each of the material layers is relatively narrow. This causes the narrow width effect during the etching process, so that the etching rate in the vertical direction is much less than the etching rate in the lateral direction due to the narrow width effect. As a result, the etching is conducted dominantly in the lateral direction, but significantly less in the vertical direction.

Subsequently, as shown in FIG. 3(*j*), the p-type doped polysilicon layer 204*a* may be selectively etched with respect to the functional layer (202-1 and 202-2) to remove the mask layer. Thus, an arrangement where the functional layer (202-1 and 202-2) is formed on both sides of the protruding structure 201 on the first material layer 200 is achieved, as shown in FIG. 3(*j*). The functional layer (202-1 and 202-2) may have a thickness substantially determined by the thickness of the sub-layers 202-1 and 202-2.

Here, the functional layer (202-1 and 202-2) may have a portion still remained on top of the protruding structure 201. This has almost no impact on the performance of a finally achieved device in most cases. For example, in the situation of the FinFET, the portion of the functional layer (202-1 and 202-2) (e.g., $SiO_2$) remained on top of the fin 201 will result in a two-gate FinFET.

Further, as shown in FIG. 3(*j*), the functional layer (202-1 and 202-2) may have its portions near the side walls of the protruding structure 201 protrude slightly. Such protruding portions generally will not impact the performance of the finally achieved device. In the following, those protruding portions are omitted from the drawings for convenience.

In the above example, the functional layer comprises oxide. However, the present disclosure is not limited thereto. For example, the functional layer may comprise nitride. Further, in the above example, the spacers 203 comprise undoped polysilicon, and the mask layer comprises p-type doped polysilicon. However, the present disclosure is not limited thereto. Those skilled in the art will appreciate that the spacers 203 and the mask layer can comprise any suitable materials provided that those materials can provide appropriate etching selectively in the respective etching processes.

Figure 4:
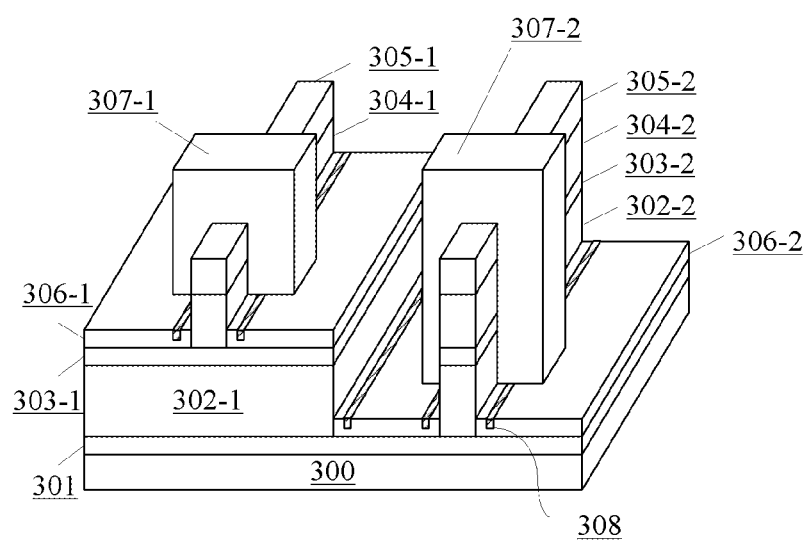
FIG. 4 is a perspective view schematically showing a semiconductor device according to an embodiment of the present disclosure.

FIG. 4 is a perspective view schematically showing a semiconductor device according to an embodiment of the present disclosure. In this embodiment, in addition to the controlled lateral etching as described above, fins of different heights are incorporated into the device.

Specifically, as shown in FIG. 4, the semiconductor device comprises a substrate 300 such as a bulk Si substrate, and a semiconductor layer ("a first material layer") formed thereon. The semiconductor layer may comprise semiconductor sub-layers 301, 302-1 and 302-2, 303-1 and 303-2, and 304-1 and 304-2, which are arranged on top of each other. For example, the semiconductor sub-layer 301 may comprise SiGe (where the atomic percentage of Ge may be about 5-20%) with a thickness of about 2-15 nm, the semiconductor sub-layer 302-1, 302-2 may comprise Si with a thickness of about 20-150 nm, the semiconductor sub-layer 303-1, 303-2 may comprise SiGe (where the atomic percentage of Ge may be about 5-20%) with a thickness of about 1-10 nm, and the semiconductor sub-layer 304-1, 304-2 may comprise Si with a thickness of about 20-150 nm.

Fins can be formed by patterning those semiconductor sub-layers. Specifically, the fin on the left side as shown in FIG. 4 consists of the patterned semiconductor sub-layer 304-1, and the fin on the right side as shown in FIG. 4 consists of the patterned semiconductor layers 302-2, 303-2, and 304-2. There are also an isolation layer 306-1 and 306-2 on both sides of the respective fins, which can be formed by the method according to the present disclosure. The isolation layer 306-1 and 306-2 may have residual spacer fractions 308 still remained therein.

In FIG. 4, a layer 305-1 and 305-2 is also shown on top of the fins. This layer 305-1 and 305-2 may comprise a hard mask layer used for patterning the fins and residual fractions of the isolation layer left in the process of manufacturing the isolation layer, which are still remained on top of the fins.

The semiconductor device further comprises gate stacks 307-1 and 307-2 (specific configuration of which, such as a gate dielectric layer and a gate electrode layer, is not shown) crossing over the respective fins. The gate stacks may be separated from the semiconductor layer by the isolation layer 306-1 and 306-2.

In this embodiment the fin in the left region ("a first region") and the fin in the right region ("a second region") have different heights from each other. It is to be noted that in the context of the present disclosure a "height" of a fin refers to an extent from a top surface of the fin to a bottom surface of the fin (that is, a surface of the semiconductor layer against which the fin abuts). For example, in the example shown in FIG. 4, the fin in the first region has a height being equal to the extent from the top surface of the semiconductor sub-layer 304-1 (i.e., the top surface of the fin in the first region) to the top surface of the semiconductor sub-layer 303-1 (i.e., a surface of the portions of the semiconductor layer other than the fin in the first region), and the fin in the second region has a height being equal to the extent from the top surface of the semiconductor sub-layer 304-2 (i.e., the top surface of the fin in the second region) to the top surface of the semiconductor sub-layer 301 (i.e., a surface of the portions of the semiconductor layer other than the fin in the second region).

Here, the term "abut (against)" or "abutting (against)" refers to that the fin directly contacts the semiconductor layer, without any intervening layers. There may also be such a situation that the semiconductor layer has an underlying layer such as the substrate 300. In this situation, a fin can extend through the whole semiconductor layer (that is, the semiconductor layer is adopted in its entire thickness to form the fin having such a thickness). Then, the bottom surface of the fin will overlap with the bottom surface of the semiconductor layer. In the context of the present disclosure, this situation is also considered as that the fin "abuts (against)" the semiconductor layer because there is no intervening layer between the fin and the semiconductor layer.

In this embodiment, the semiconductor layer (i.e., the first material layer) comprises a number of semiconductor sub-layers, for example, a stack of alternating SiGe sub-layers and Si sub-layers as described above. The semiconductor sub-layers can be selected so that semiconductor sub-layers adjacent to each other comprise different materials from each other and have etching selectively with respect to each other. As a result, the semiconductor sub-layers can be selectively etched on a sub-layer by sub-layer basis. Thus, in patterning a fin, it is possible to have the fin formed of a well controlled number of the semiconductor sub-layers, and thus have a well controlled height (i.e., a well controlled channel width of a final device).

According to an embodiment, the semiconductor layer (i.e., the first material layer) may comprise a stack of relatively thicker fin main-body sub-layers and relatively thinner etching stop sub-layers which are arranged alternately. For example, in the above example, the semiconductor sub-layers 302-1 and 302-2, and 304-1 and 304-2, which are relatively thicker, serve as the fin main-body sub-layers (e.g., Si in this example), and the semiconductor sub-layers 301, and 303-1 and 303-2, which are relatively thinner, serve as the etching stop sub-layers (e.g., SiGe in this example) with respect to the fin main-body sub-layers. In this way, by alternating the fin main-body sub-layers and the etching stop sub-layers, etching of the respective fin main-body sub-layers can be stopped substantially precisely on the respective etching stop sub-layers. Thus, in patterning a fin, it is possible to well control the number of the fin main-body sub-layers which dominantly determine the height of the fin.

Hereinafter, an example method for manufacturing the semiconductor device shown in FIG. 4 will be described with reference to FIG. 5. The following descriptions are given with respect to Si based materials, by way of example. However, it is to be understood that the present disclosure is not limited to the Si based materials, but is also applicable to other semiconductor materials.

As shown in FIG. 5(a), on a substrate 300 provided is a semiconductor layer comprising a first semiconductor sub-layer 301, a second semiconductor sub-layer 302, a third semiconductor sub-layer 303, and a fourth semiconductor sub-layer 304 which are arranged on top of each other. For example, the substrate 300 may comprise a bulk Si substrate, the semiconductor sub-layer 301 may comprise SiGe (where the atomic percentage of Ge may be about 5-20%) with a thickness of about 2-15 nm, the semiconductor sub-layer 302 may comprise Si with a thickness of about 20-150 nm, the semiconductor sub-layer 303 may comprise SiGe (where the atomic percentage of Ge may be about 5-20%) with a thickness of about 1-10 nm, and the semiconductor sub-layer 304 may comprise Si with a thickness of about 20-150 nm.

Further, an oxide layer (e.g., silicon oxide) and a nitride layer (e.g., silicon nitride), which are indicated together as "305a" in the figure, are sequentially formed on the semiconductor layer. For example, the oxide layer may have a thickness of about 2-5 nm, the nitride layer may have a thickness of about 10-50 nm. The oxide layer and the nitride layer 305a serve as a hard mask in the subsequent processes. Further, a patterned photo resist layer 309 may be formed on the nitride layer so that it is positioned on regions corresponding to tins to be formed.

Next, as shown in FIG. 5(b), the hard mask layer 305a can be patterned. Specifically, the nitride layer may be etched by means of, for example, RIE, by using the patterned photo resist layer 309 as a mask. The etching can be stopped on the oxide layer. After that, the oxide layer is further etched by means of, for example, RIE. The etching can be stopped on the Si sub-layer 304. This results in the patterned hard mask layer 305a-1, 305a-2. Finally, the photo resist layer 309 can be removed.

Then, as shown in FIGS. 5(c) and 5(d), the semiconductor layer can be patterned by means of, for example, RIE by using the patterned hard mask layer 305a-1, 305a-2 as a mask, resulting in fins in the semiconductor layer. Specifically, as shown in FIG. 5(c), firstly the Si sub-layer 304 is etched selectively with respect to the SiGe sub-layer 303, resulting in the patterned Si sub-layer 304-1, 304-2. The, as shown in FIG. 5(d), the region on the left side ("a first region") can be covered by a protection layer 310 such as a photo resist layer, and the region on the right side ("a second region") can be further patterned. More specifically, in the second region, the SiGe sub-layer 303 is etched selectively with respect to the Si sub-layer 302, resulting in the patterned SiGe sub-layer 303-2 (a portion of the SiGe sub-layer 303 remaining in the first region is shown as 303-1), and then the Si sub-layer 302 is etched selectively with respect to the SiGe sub-layer 301, resulting in the patterned Si sub-layer 302-2 (a portion of the Si sub-layer 302 remaining in the first region is shown as 302-1). Finally, the protection layer 310 can be removed.

Thus, in the first region a first fin is formed, which consists of the patterned Si sub-layer 304-1, and in the second region a second fin is formed, which consists of the patterned Si sub-layer 304-2, the patterned SiGe sub-layer 303-2, and the patterned Si sub-layer 302-2.

In this embodiment, the semiconductor sub-layers adjacent to each other (e.g., the Si sub-layer and the SiGe sub-layer) have different materials from each other, and have etching selectively with respect to each other. Thus, in patterning the fins, the semiconductor sub-layers can be etched on a sub-layer by sub-layer basis. As a result, it is possible to have the heights of the finally obtained fins well controlled. Specifically, in this embodiment, the first fin and the second fin comprise different numbers of the patterned semiconductor sub-layers, and thus have different heights from each other.

Further, in this embodiment, the relatively thicker Si sub-layers serve as the fin main-body sub-layers, and the relatively thinner SiGe sub-layers serve as the etching stop sub-layers for the Si sub-layers. Thus, the number of the Si sub-layers serving as the fin main-body sub-layers and thus the heights of the finally achieved fins can be well controlled due to the etching stop function of the SiGe sub-layers.

In this embodiment, the semiconductor layer comprises two Si sub-layers serving as the fin main-body sub-layers (and two corresponding SiGe sub-layers serving as the etching stop sub-layers), and are patterned to form two fins of different heights. However, the present disclosure is not limited thereto. The semiconductor layer may comprise any number of semiconductor sub-layers, and may be patterned to form any number of fins of different heights.

Then, as shown in FIG. 5(e), a material layer 306, e.g., $SiO_2$, may be formed on the arrangement shown in FIG. 5(d) according to the above described process (specifically, that described with reference to FIGS. 3(a)-3(d)). For example, the material layer 306 may comprise two sub-layers with a thickness of about 5-10 nm. On vertical surfaces of the respective fins, spacers 308, e.g., undoped amorphous silicon, with a thickness of about 5-10 nm may be inserted between the two sub-layers. Here, the semiconductor layer has its surfaces in the first region and in the second region not leveled to each other, and an interface between the first region and the second region are substantially vertical to the substrate surface. Thus, there is also an arrangement of two sub-layers sandwiching a spacer formed on the interface. Further, a undoped amorphous silicon layer 311 with a thickness of about 5-10 nm is formed on the material layer 306.

Next, the material layer 306 may be laterally etched according to the process described above with reference to FIGS. 3(e)-3(j), to form an isolation layer 306-1 and 306-2 on both sides of the respective fins, as shown in FIG. 5(f). Residual fractions of the material layer 306 remained on top of the respective fins are shown as 305b-1 and 305b-2. In the following, the hard mask layer 305a-1 and 305a-2 and the fractions 305b-1 and 305b-2 of the material layer on top of the fins are together shown as 305-1 and 305-2.

Then, as shown in FIG. 5(g), a gate dielectric layer 307a, a work function adjustment layer 307b, and a gate electrode layer 307c can be formed by means of, for example, deposition, to cross over the respective fins. For example, the gate dielectric layer 307a may comprise high-K dielectric such as $HfO_2$, HfSiO, HfSiON, HfTaO, HfTiO, HfZrO, $Al_2O_3$, $La_2O_3$, $ZrO_2$, LaAlO, and the like, with a thickness of about 2-4 nm, the work function adjustment layer 307b may comprise TiN, TiAlN, TaN, TaAlN, TaC, and the like, and the gate electrode layer may comprise polysilicon.

Next, as shown in FIG. 5(h), final gate stacks can be formed by patterning. Specifically, the gate electrode layer 307c and the work function adjustment layer 307b (and optionally the gate dielectric layer 307a) can be etched by means of for example, RIE, so that the respective gate stacks are electrically isolated from each other, resulting in gate stacks 307-1 and 307-2. After that, the process can proceed as in the conventional process for formation of source and drain regions, metal interconnection, and the like, to obtain a final device.

Figure 5:
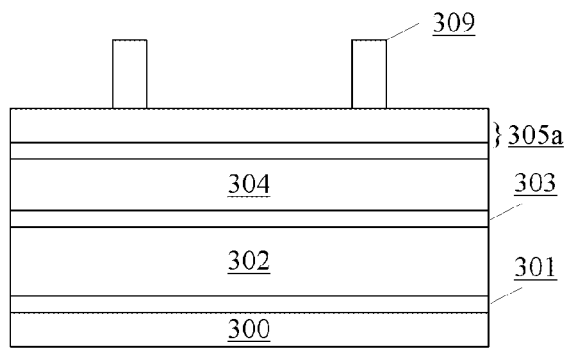
FIGS. 5(a)-5(h) are schematic sectional views showing a flow of manufacturing the semiconductor device shown in FIG. 4 according to an embodiment of the present disclosure.
Figure 5:
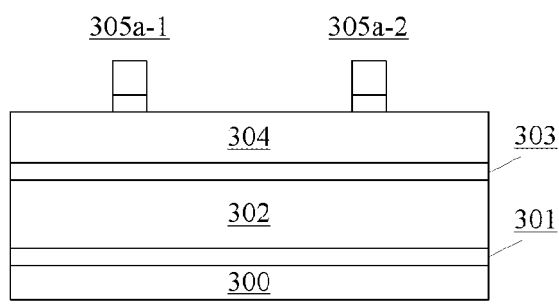
Figure 5:
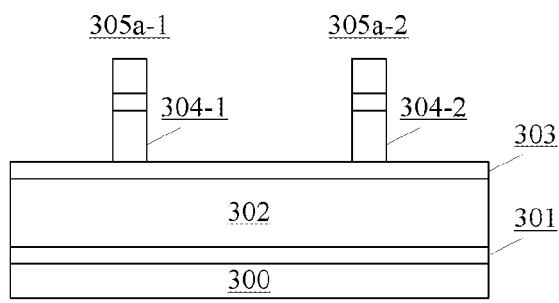
Figure 5:
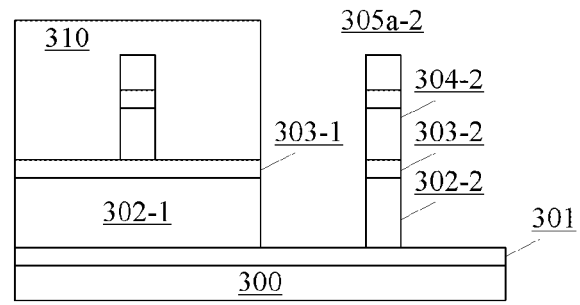
Figure 5:
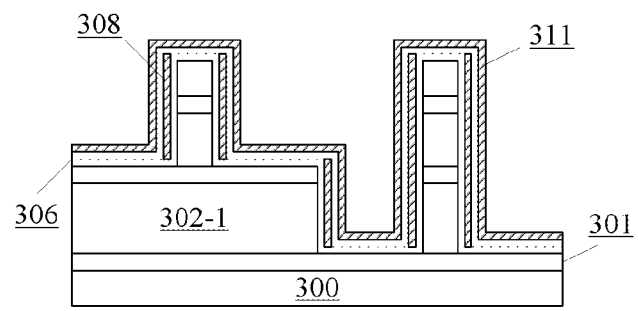
Figure 5:
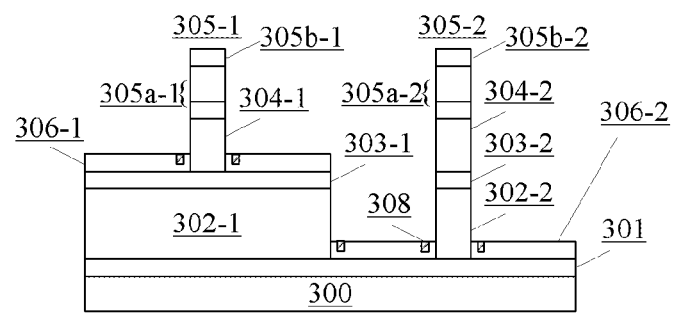
Figure 5:
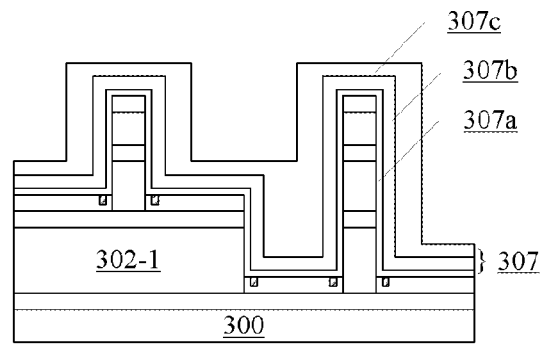
Figure 5:
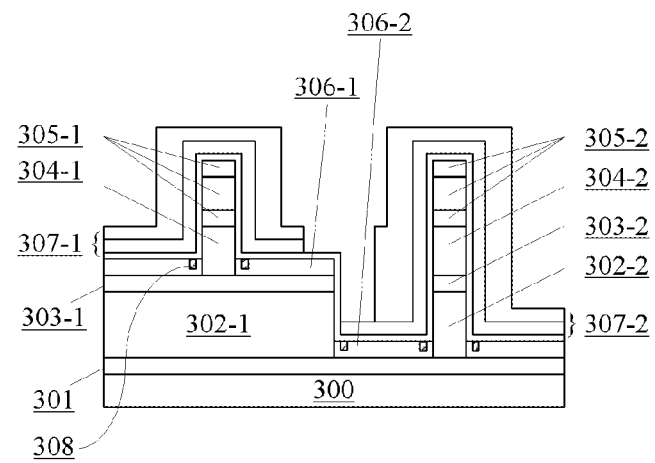

Thus, the semiconductor device according to this embodiment is achieved, as shown in FIG. 4 (in the perspective view of FIG. 4, the gate stacks are shown schematically for convenience, and thus do not completely correspond to those shown in the sectional view of FIG. 5).

Figure 6:
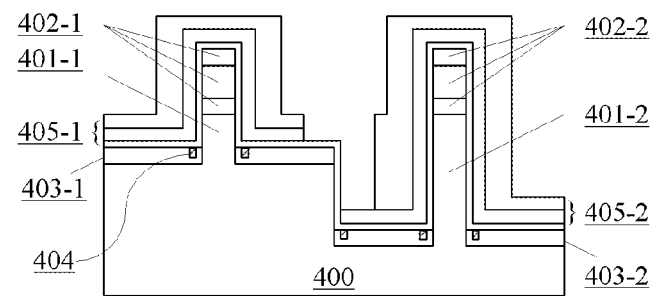
FIG. 6 is a perspective view schematically showing a further semiconductor device according to a further embodiment of the present disclosure.

FIG. 6 is a perspective view schematically showing a semiconductor device according to a further embodiment of the present disclosure. The device shown in FIG. 6 is substantially same as that shown in FIG. 5(h), except that the fins are formed from one semiconductor layer.

Specifically, as shown in FIG. 6, the semiconductor device comprises a semiconductor layer ("a first material layer") 400, which, for example, may comprise a bulk Si semiconductor layer. In this semiconductor layer 400, tow fins 401-1 and 401-2 of different heights are formed. Those two fins 401-1 and 401-2 can be manufactured by a process similar to that shown in FIGS. 5(a)-5(d). In patterning the fins by etching the semiconductor layer, the etching depths into the semiconductor layer can be controlled by the process parameters such as etching time. On top of the respective fins 401-1 and 401-2, there may be a layer 402-1 and 402-2 which comprise a hard mask layer and residual fractions of an isolation layer. Gate stacks 405-1 and 405-2 are formed to cross over the respective fins 401-1 and 401-2.

The isolation layer 403-1 and 403-2, which can be manufactured by the process according to the present disclosure, is also formed on both sides of the respective fins 401-1 and 401-2. The isolation layer 403-1 and 403-2 may have residual spacer fractions 404 still remained therein. The gate stacks 405-1 and 405-2 are separated from the semiconductor layer by the isolation layer 403-1 and 403-2, respectively.

In the above descriptions, details of patterning and etching of the layers are not described. It is understood by those skilled in the art that various measures may be utilized to form the layers and regions in desired shapes. Further, to achieve the same feature, those skilled in the art can devise processes not entirely the same as those described above. The mere fact that the respective embodiments describe various features does not necessarily imply that those features cannot be used in combination to advantage.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A method of controlled lateral etching, comprising:
    forming a second material layer on a first material layer having a protruding structure, the second material layer comprising laterally extending portions and vertically extending portions;
    forming spacers on outer surfaces of the second material layer opposite to vertical surfaces of the protruding structure;
    forming a third material layer on surfaces of the second material layer and the spacers, the third material layer comprising laterally extending portions and vertically extending portions;
    forming a mask layer, which extends in a direction lateral to a surface of the first material layer, on the third material layer; and
    laterally etching the vertically extending portions of the third material layer, the spacers, and the vertically extending portions of the second material layer sequentially, to leave a functional layer composed of the laterally extending portions of the second material layer and the laterally extending portions of the third material layer on the first material layer.

2. The method of controlled lateral etching according to claim 1, wherein the mask layer comprises doped polysilicon.

3. The method of controlled lateral etching according to claim 2, wherein forming the mask layer comprises:
    forming a undoped amorphous silicon layer on the third material layer;
    implanting dopants into portions of the amorphous silicon layer extending in the direction lateral to the surface of the first material layer;
    performing annealing to activate the dopants and convert the amorphous silicon into polysilicon; and
    selectively etching the undoped polysilicon with respect to the doped polysilicon so as to form the mask layer.

4. The method of controlled lateral etching according to claim 2, wherein the second and third material layers both comprise oxide, and the spacers comprise undoped polysilicon.

5. The method of controlled lateral etching according to claim 1, wherein before formation of the mask layer, the method further comprises:

forming further spacers on outer surfaces of the third material layer opposite to the vertical surfaces of the protruding structure;

forming a further material layer on surfaces of the third material layer and the further spacers, wherein the mask layer is formed on the further material layer.

6. The method of controlled lateral etching according to claim 1, wherein the protruding structure comprises a fin.

7. The method of controlled lateral etching according to claim 6, wherein a plurality of fins are formed on the first material layer, and wherein at least two of the fins have different heights.

8. The method of controlled lateral etching according to claim 7, wherein the fins are formed by:

patterning the first material layer in a first region thereof to form a first fin; and patterning the first material layer in a second region thereof to form a second fin, wherein the first fin has a different height than the second fin.

9. The method of controlled lateral etching according to claim 8, wherein the first material layer comprises a plurality of semiconductor sub-layers, wherein adjacent semiconductor sub-layers have different materials so that they can be selectively etched with respect to each other;

patterning the first material layer in the first region thereof comprises patterning the first material layer so that the first fin is formed by a first number of semiconductor sub-layers; and patterning the first material layer in the second region thereof comprises patterning the first material layer so that the second fin is formed by a second number of semiconductor sub-layers.

10. The method of controlled lateral etching according to claim 9, wherein the first material layer comprises a stack of fin main-body sub-layers and etching stop sub-layers which are arranged alternately, wherein the fin main-body sub-layers are thicker than the etching stop sub-layers.

11. The method of controlled lateral etching according to claim 10, wherein the fin main-body sub-layers comprise Si, and the etching stop sub-layers comprise SiGe.

* * * * *